(12) United States Patent
Huang et al.

(10) Patent No.: US 11,355,471 B2
(45) Date of Patent: Jun. 7, 2022

(54) SYSTEM FOR PROCESSING SEMICONDUCTOR DEVICES

(71) Applicant: Taiwan Semiconductor Manufacturing Company, Ltd., Hsinchu (TW)

(72) Inventors: Kuei-Wei Huang, Hsinchu (TW); Hsiu-Jen Lin, Zhubei (TW); Ai-Tee Ang, Hsinchu (TW); Ming-Da Cheng, Jhubei (TW); Chung-Shi Liu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 369 days.

(21) Appl. No.: 16/051,235

(22) Filed: Jul. 31, 2018

(65) Prior Publication Data

US 2018/0358325 A1 Dec. 13, 2018

Related U.S. Application Data

(62) Division of application No. 14/106,507, filed on Dec. 13, 2013, now Pat. No. 10,109,612.

(51) Int. Cl.
*H01L 23/00* (2006.01)

(52) U.S. Cl.
CPC .............. *H01L 24/81* (2013.01); *H01L 24/75* (2013.01); *H01L 24/97* (2013.01); *H01L 24/11* (2013.01);
(Continued)

(58) Field of Classification Search
CPC ..... H01L 21/7688; H01L 24/97; H01L 24/81; H01L 24/75; H01L 24/11; H01L 24/13; H01L 24/16; H01L 2224/11334; H01L 2224/11422; H01L 2224/11424; H01L 2224/1308; H01L 2224/131; H01L 2224/13109; H01L 2224/13111; H01L 2224/13116; H01L 2224/16227; H01L 2224/75101; H01L 2224/75252; H01L 2224/75253; H01L 2224/75283; H01L 2224/75651; H01L 2224/75754;
(Continued)

(56) References Cited

U.S. PATENT DOCUMENTS 8,440,503 B1 5/2013 Lin et al.
9,773,719 B2 * 9/2017 Meinhold .......... H01L 23/3185
(Continued)

FOREIGN PATENT DOCUMENTS

| CN | 103325690 A | 9/2013 | |
|---|---|---|---|
| DE | 102014019343 A1 * | 7/2015 | ............. H01L 24/75 |
| JP | 2000021931 A | 1/2000 | |

*Primary Examiner* — Jeffrey T Carley
(74) *Attorney, Agent, or Firm* — Slater Matsil LLP (57) ABSTRACT

Tools and systems for processing semiconductor devices, and methods of processing semiconductor devices are disclosed. In some embodiments, a method of using a tool for processing semiconductor devices includes a tool with a second material disposed over a first material, and a plurality of apertures disposed within the first material and the second material. The second material comprises a higher reflectivity than the first material. Each of the apertures is adapted to retain a package component over a support during an exposure to energy.

20 Claims, 5 Drawing Sheets

(52) U.S. Cl.
CPC .............. *H01L 24/13* (2013.01); *H01L 24/16* (2013.01); *H01L 2224/11334* (2013.01); *H01L 2224/11422* (2013.01); *H01L 2224/11424* (2013.01); *H01L 2224/131* (2013.01); *H01L 2224/1308* (2013.01); *H01L 2224/13109* (2013.01); *H01L 2224/13111* (2013.01); *H01L 2224/13116* (2013.01); *H01L 2224/16227* (2013.01); *H01L 2224/759* (2013.01); *H01L 2224/7598* (2013.01); *H01L 2224/75101* (2013.01); *H01L 2224/75252* (2013.01); *H01L 2224/75253* (2013.01); *H01L 2224/75283* (2013.01); *H01L 2224/75651* (2013.01); *H01L 2224/75754* (2013.01); *H01L 2224/8113* (2013.01); *H01L 2224/8121* (2013.01); *H01L 2224/8122* (2013.01); *H01L 2224/8123* (2013.01); *H01L 2224/81132* (2013.01); *H01L 2224/81191* (2013.01); *H01L 2224/81192* (2013.01); *H01L 2224/81193* (2013.01); *H01L 2224/81224* (2013.01); *H01L 2224/81801* (2013.01); *H01L 2224/81805* (2013.01); *H01L 2224/81815* (2013.01); *H01L 2224/97* (2013.01); *H01L 2924/3511* (2013.01); *Y10T 29/49144* (2015.01)

(58) Field of Classification Search
CPC ....... H01L 2224/759; H01L 2224/7598; H01L 2224/8113; H01L 2224/81132; H01L 2224/81191; H01L 2224/81192; H01L 2224/81193; H01L 2224/8121; H01L 2224/8122; H01L 2224/81224; H01L 2224/8123; H01L 2224/81801; H01L 2224/81805; H01L 2224/81815; H01L 2224/97; H01L 2924/3511; H05K 3/007; Y10T 29/49144

See application file for complete search history.

(56) References Cited

U.S. PATENT DOCUMENTS

| | | | |
|---|---|---|---|
| 2007/0222065 A1* | 9/2007 | Andry | H01L 24/81 257/723 |
| 2010/0059782 A1 | 3/2010 | Fujitomo et al. | |
| 2011/0024786 A1* | 2/2011 | Sugiyama | H01L 24/97 257/99 |
| 2011/0175238 A1* | 7/2011 | Illek | H01L 24/97 257/782 |
| 2013/0122652 A1* | 5/2013 | Lin | H01L 24/75 438/107 |
| 2013/0143361 A1 | 6/2013 | Lin et al. | |
| 2013/0241077 A1 | 9/2013 | Fuergut et al. | |
| 2014/0077369 A1* | 3/2014 | Liang | H01L 21/2855 257/738 |

* cited by examiner

SYSTEM FOR PROCESSING SEMICONDUCTOR DEVICES

PRIORITY CLAIM AND CROSS-REFERENCE

This application is a divisional of U.S. application Ser. No. 14/106,507, entitled "Tools and Systems for Processing Semiconductor Devices, and Methods of Processing Semiconductor Devices," filed on Dec. 13, 2013, which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, as examples.

In some packaging methods for integrated circuits, device dies or packages are packaged onto package substrates, which include metal connections that are used to route electrical signals between opposite sides of the package substrates. The device dies may be bonded onto one side of a package substrate using flip chip bonding, and a reflow process may be performed to melt solder balls that interconnect the dies and the package substrates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure are related to tools for processing semiconductor devices, systems that implement the tools, and methods of processing semiconductor devices using the tools and systems. The tools comprise novel jigs for use during solder reflow processes for semiconductor devices in some embodiments, which will be described further herein.

Figure 1:
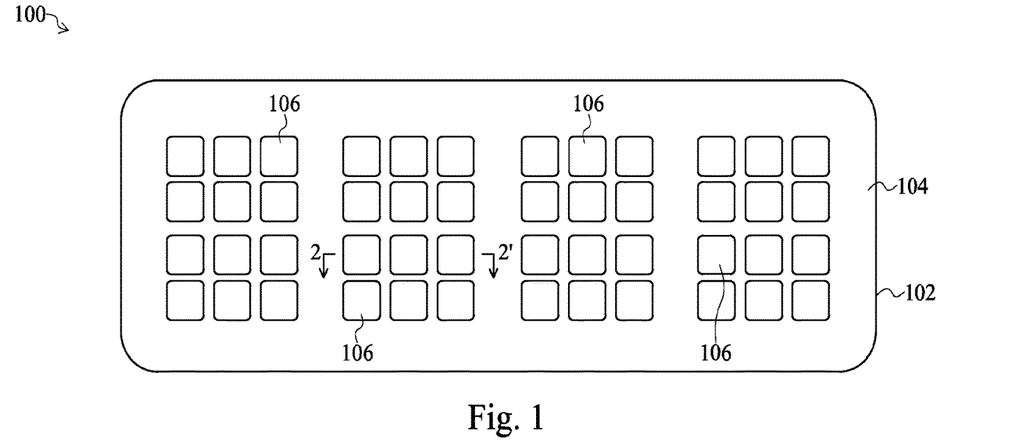
FIG. 1 is a top view of a tool for processing semiconductor devices in accordance with some embodiments.
Figure 2:
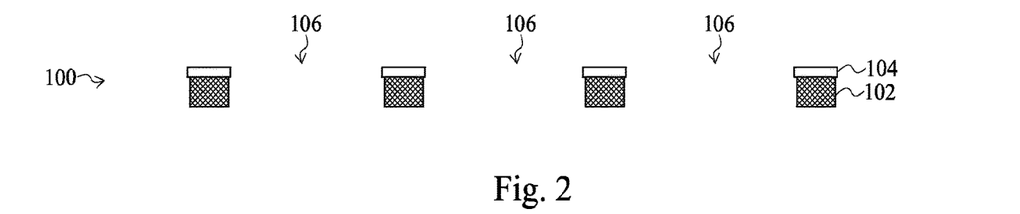
FIG. 2 is a cross-sectional view of a portion of the tool shown in FIG. 1 in accordance with some embodiments.

Referring first to FIG. 1, there is shown a top view of a tool 100 for processing semiconductor devices in accordance with some embodiments of the present disclosure. The tool 100 comprises a jig or a cover that may be used in a solder reflow process or a solder bonding process to retain package components in a desired position during the solder reflow or bonding process in some embodiments, for example. FIG. 2 is a cross-sectional view of a portion of the tool 100 at the view shown at 2-2' in FIG. 1 in accordance with some embodiments.

The tool 100 comprises a first material 102 and a second material 104 disposed over the first material 102. The first material 102 comprises a metal or metal alloy such as copper, aluminum, steel or the like; one or more ceramic materials; or a combination or multiple layers thereof in accordance with some embodiments. The first material 102 comprises a thickness of about 1 mm to about 3 mm in some embodiments, for example. Alternatively, the first material 102 may comprise other materials and dimensions.

The second material 104 comprises a metal in some embodiments. The metal may comprise Au, Ag, Cu, Cr, Zn, Sn, or combinations or multiple layers thereof, for example. The metal may comprise a thickness of about 100 Angstroms to about 1 μm in some embodiments, for example.

In other embodiments, the second material 104 comprises a thin film material. The thin film material has a thickness of about 1 μm or less in some embodiments. The thin film material comprises a material such as a $TiO_2$-doped epoxy, a $TiO_2$-doped polymer, other materials, or combinations or multiple layers thereof in some embodiments.

Alternatively, the metal and/or the thin film material of the second material 104 may comprise other materials and dimensions.

In some embodiments, the second material 104 comprises one or more metals and one or more thin film material, as another example. Combinations or multiple layers of one or more metal and/or one or more thin film material may be used for the second material 104, for example.

The second material 104 may be formed over the first material 102 using a coating process or a deposition process. Alternatively, other methods may be used to form the second material 104.

The second material 104 is formed over the entire first material 102 of the tool 100 in some embodiments. In other embodiments, the second material 104 is formed in selective regions of the tool 100.

The second material 104 of the tool 100 comprises a higher reflectivity than the first material 102 in some embodiments. For example, the first material 102 comprises a first reflectivity and the second material 104 comprises a second reflectivity in some embodiments, wherein the second reflectivity of the second material 104 comprises a higher reflectivity to infrared (IR) energy and/or radiation energy than the first reflectivity of the first material 102. In other embodiments, the first material 102 comprises a first reflectivity to IR energy and/or radiation energy, and the second material 104 comprises a second reflectivity to IR energy and/or radiation energy, the second reflectivity being greater than the first reflectivity, as another example.

In some embodiments, the second material 104 is adapted to reflect IR energy or radiation energy emitted from a radiation energy source (not shown in FIGS. 1 and 2; see radiation energy source 130 shown in FIG. 7) at a predetermined wavelength range. The predetermined wavelength range comprises about 800 nm to about 100,000 µm in some embodiments. The second material 104 is adapted to reflect greater than about 70% of the predetermined wavelength range in some embodiments.

Alternatively, the second material 104 may be adapted to reflect IR energy and/or radiation energy at other wavelengths and in other percentages of the predetermined wavelength range.

The tool 100 includes a plurality of apertures 106 disposed within the first material 102 and the second material 104. Each of the plurality of apertures 106 is adapted to retain a package component over a support (not shown in FIGS. 1 and 2; see second package component 120 and support 108 shown in FIG. 6). The apertures 106 may comprise a dimension that is substantially the same as, or slightly larger than, the size of the second package component 120 in a top view in accordance with some embodiments, for example. In accordance with some embodiments, the plurality of apertures 106 is adapted to support a plurality of second package components 120 on a package component (also not shown in FIGS. 1 and 2; see first package component 110 shown in FIG. 6) during a eutectic material bonding process or solder bonding process, for example, to be described further herein.

The second material 104 comprising the high-reflectivity material reflects IR energy or radiation energy during the eutectic material bonding process for the second package components 120, which is advantageous in many aspects, such as providing reduced thermal expansion, reduced warpage, and increased overall product yields due to higher joint yields, to be described further herein.

Figure 3:
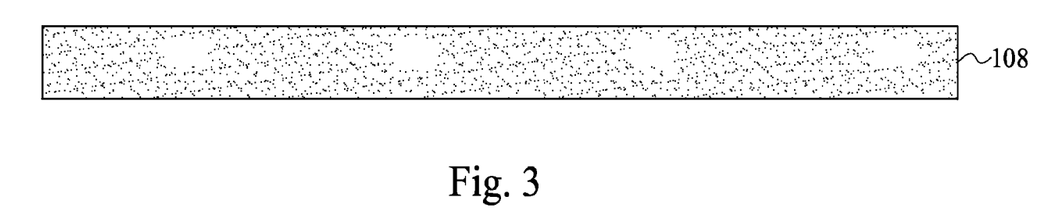
FIGS. 3 through 8 illustrate cross-sectional views of a method of processing semiconductor devices at various stages in accordance with some embodiments.

FIGS. 3 through 8 illustrate cross-sectional views of a method of processing semiconductor devices at various stages in accordance with some embodiments. In FIG. 3, a support 108 is provided. The support 108 comprises similar materials described for the first material 102 of the tool 100 in some embodiments, for example. The support 108 comprises a thickness of about 5 mm to about 10 mm of a Fe alloy, an Al alloy, or combinations or multiple layers thereof, as examples. The support 108 and also the tool 100 may comprise a length and width in a top view of about 300 mm×about 700 mm, as examples. Alternatively, the support 108 (and also the tool 100) may comprise other materials and dimensions. In some embodiments, the support 108 comprises a board or a boat adapted to support a first package component 110 (see FIG. 4).

Figure 4:
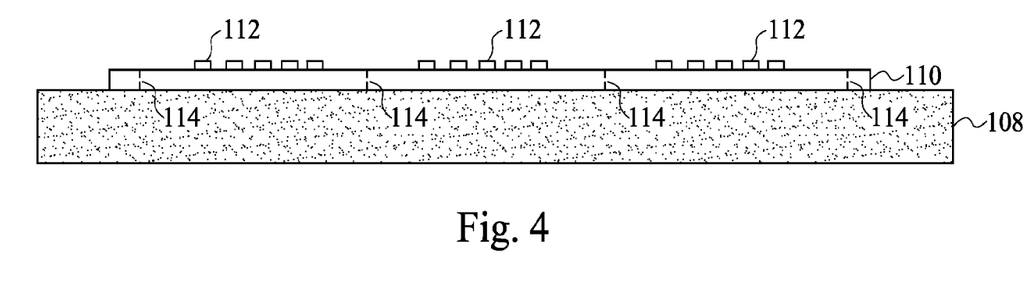

In FIG. 4, a package component 110 is provided. The package component 110 is placed on the support 108. The package component 110 comprises a packaging device in some embodiments. The package component 110 is also referred to herein as a first package component 110, a plurality of first package components 110, or a strip of a plurality of first package components 110. In some embodiments, the first package component 110 comprises a packaging device comprising an interposer substrate comprising through-vias, other circuitry, and/or one or more redistribution layers (RDLs) disposed thereon or formed therein (not shown). In other embodiments, the first package component 110 comprises a packaging device comprising an organic material. The first package component 110 may comprise a laminate substrate, which includes a plurality of dielectric films laminated together. In yet other embodiments, the first package component 110 comprises a plurality of integrated circuit dies. The first package component 110 may alternatively comprise other materials and types of devices.

In some embodiments, the first package component 110 comprises a strip of a plurality of the first package components 110. For example, the strip of the plurality of first package components 110 may comprises substantially a same shape and/or dimensions as the tool 100 shown in FIG. 1, in a top view. The strip includes one of the first package components 110 proximate each one of the apertures 106 of the tool, for example. The first package components 110 may be distributed uniformly throughout the strip, and may have a pattern of an array. In other embodiments, the first package components 110 may be distributed as a plurality of groups, with the inter-group spacing between the groups being greater than the inner-group spacing between first package components that are in the same group, as shown for the apertures 106 of the tool 100 in FIG. 1. The individual first package components 110 are later singulated along scribe lines 114 of the strip of first package components 110 after a solder reflow process, in some embodiments.

The strip of first package components 110 comprises a plurality of regions where second package components 120 will be bonded to the first package components 110, also to be described further herein. For example, the first package components 110 include a plurality of contact pads 112 formed thereon. Only three regions including five contact pads 112 each are shown in FIGS. 4 through 8; alternatively, dozens, hundreds, or more contact pads 112 may be disposed in each region where a second package component 120 will be bonded to the first package component 110, in some embodiments. The contact pads 112 comprise electrical connections, and may comprise pre-solder regions, metal pads, non-reflowable metal bumps, or metal features, as examples. The contact pads 112 may be coupled to bond pads on an opposite side of the first package components 110, not shown, by electrical features such as metal lines and vias disposed within the first package components 110, also not shown, in some embodiments.

Figure 5:
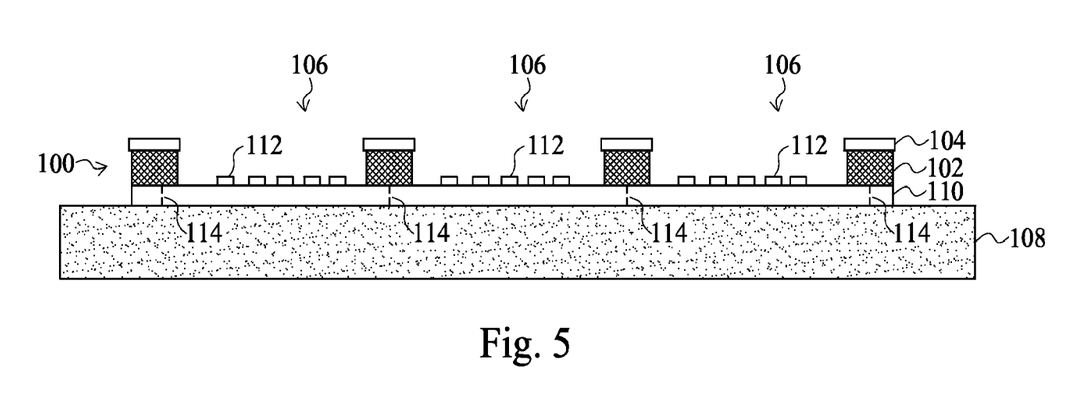

A tool 100 described herein with reference to FIGS. 1 and 2 is disposed over the first package component 110, as shown in FIG. 5. The apertures 106 of the tool 100 are disposed over the first package components 110 of the strip of the first package components so that the first package components 110 are exposed. Other portions of the tool 100, i.e., the solid portions comprising the first material 102 and the second material 104, are disposed over and proximate the scribe line regions 114 of the strip of the first package components 110, between the apertures 106.

The tool 100 may be placed directly adjacent and abutting the first package component 110 as shown in FIG. 5 in some embodiments. The tool 100 may be clamped to the support 108 or another object in some embodiments, for example. In other embodiments, the tool 100 may be placed proximate the first package component 110 yet not abutting the first package component 110 (not shown). The apertures 106 of the tool 100 leave the contact pads 112 of the first package components 110 exposed. The contact pads 112 of the first package components 110 are exposed through the apertures 106 in the tool 100, permitting access to the contact pads 112 for a bonding process.

Figure 6:
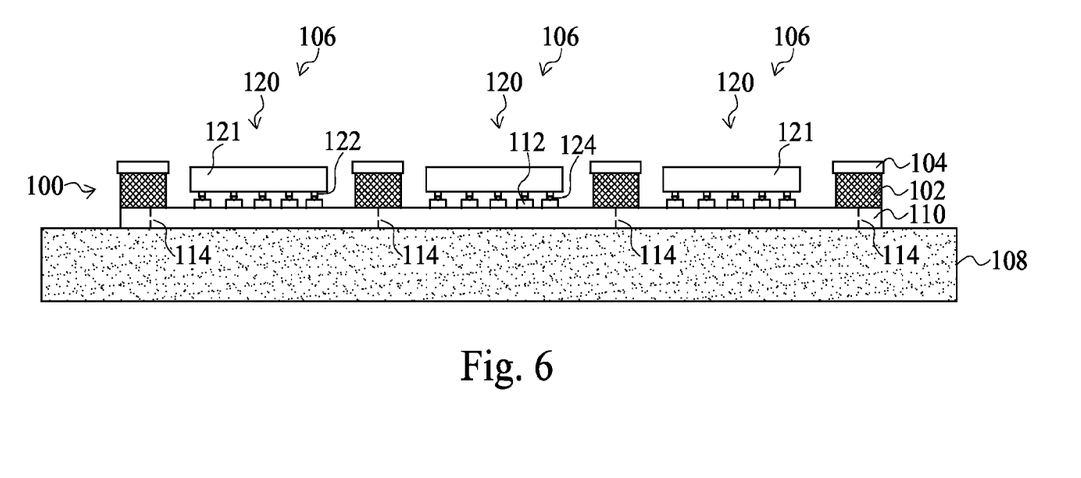

A package component 120 is placed within at least one of the plurality of apertures 106 of the tool 100 disposed over the first package components 110 in some embodiments, as shown in FIG. 6. The package components 120 are also referred to herein as second package components 120. In some embodiments, a plurality of second package components 120 is placed within the plurality of apertures 106 of the tool 100, with one of the plurality of second package components 120 being placed within each one of the plurality of apertures 106 of the tool 100, as illustrated in FIG. 6. The second package components 120 are placed over the first package components 110 with a one-to-one correspondence, for example. In other embodiments, second package components 120 are placed within only some of the plurality of apertures 106 of the tool 100, not shown. In yet other embodiments, two or more second package components 120 may be placed within each aperture 106 of the tool 100, not shown.

Portions of the tool 100 surround the second package components 120. In some embodiments, the portions of the tool 100 surround the second package components 120 securely, to retain the second package component 120 in place while processing the semiconductor devices, such as performing a solder reflow or bonding process.

The second package components 120 comprise semiconductor dies or semiconductor devices in some embodiments. The semiconductor dies may comprise complementary metal oxide (CMOS) devices in some embodiments, for example. Alternatively, the semiconductor dies may comprise other types of integrated circuits. In other embodiments, the second package components 120 may comprise package substrates. Alternatively, the second package components 120 may comprise other types of devices. In some embodiments, the second package components 120 are flip-chip bonded to the first package components 110, for example.

The first package components 110 are also referred to herein as second package components, e.g., in some of the claims. Likewise, the second package components 120 are also referred to herein as first package components, e.g., in some of the claims. The package components 110 and 120 are referred to as "first" or "second" depending on their order of introduction into some of the claims.

The second package components 120 each include a workpiece 121. The workpiece 121 may include a semiconductor substrate comprising silicon or other semiconductor materials and may be covered by an insulating layer, for example. The workpiece 121 may also include other active components or circuits, not shown. The workpiece 121 may comprise silicon oxide over single-crystal silicon, for example. The workpiece 121 may include other conductive layers or other semiconductor elements, e.g., transistors, diodes, etc. Compound semiconductors, GaAs, InP, Si/Ge, or SiC, as examples, may be used in place of silicon. The workpiece 121 may comprise a silicon-on-insulator (SOI) or a germanium-on-insulator (GOI) substrate, as examples.

The second package components 120 include a plurality of contact pads 122 disposed on one side of the workpiece 121. The plurality of contact pads 122 comprise a similar or substantially the same footprint as the contact pads 112 of the first package components 110 in some embodiments. The contact pads 122 of the second package components 120 will be bonded to the contact pads 112 of the first package components 110, to form an electrical and mechanical connection between the second package components 120 and the first package components 110 in accordance with some embodiments, to be described further herein.

A eutectic material 124 is disposed between the contact pads 112 of the first package components 110 and the contact pads 122 of the second package components 120. The eutectic material 124 comprises solder regions that are disposed between the first package components 110 and the second package components 120. For example, in FIG. 6, the second package components 120 include a eutectic material 124 disposed over or formed on the contact pads 122. Alternatively, the eutectic material 124 may be disposed on the contact pads 112 of the first package components, or the eutectic material 124 may be disposed on both contact pads 112 and contact pads 122, not shown.

The eutectic material 124 comprises a material that is adapted to reflow at a predetermined elevated temperature or temperature range. After elevating the temperature of the eutectic material, when the temperature is lowered, the eutectic material 124 re-solidifies, and a joint comprised of the eutectic material 124 is formed between the contact pads 122 on the second package components 120 and the contact pads 112 on the first package component 110. The eutectic material 124 may comprise a conductive bump, for example. In some embodiments, the eutectic material 124 comprises solder, and may comprise a solder bump or a solder ball, for example.

The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free eutectic material 124 such as solder balls may be formed from SnCu compounds as well, without the use of silver (Ag). Alternatively, lead-free solder connectors may include tin and silver, Sn—Ag, without the use of copper. The eutectic material 124 may be one among an array of conductive bumps formed as a grid, often referred to as a ball grid array (BGA), in some embodiments. The eutectic material 124 may alternatively be arranged in other shapes and configurations. The eutectic material 124 may comprise spherical conductive connectors and may also comprise non-spherical conductive connectors, for example. The eutectic material 124 may be formed on the second package components 120 using a solder ball drop process, a solder bath process, a solder dip process, or other methods.

The tool 100 establishes and retains the desired position of the second package components 120 in predetermined locations within the apertures 106 so that the eutectic material 124 on the contact pads 122 of the second package components 120 becomes aligned with and stays aligned with the contact pads 112 on the first package components 110. An alignment process and/or realignment process may be used to attain the correct alignment of the second package components 120 with the first package components 110 using alignment devices and/or alignment marks on the first package components 110, tool 100, and/or second package components 120 (not shown), in some embodiments.

Next, a process is performed on the second package components 120. In some embodiments, the process performed is a eutectic material 124 reflow process or solder reflow process. The reflow process causes the eutectic material 124 to reflow, so that the second package components 120 are bonded to the respective underlying first package components 110. In some embodiments, the reflow process is performed using a convection-type reflow apparatus that includes at least one IR energy source or radiation energy source, such as an IR radiant source. The reflow process comprises heating the eutectic material 124 to a temperature higher than the melting temperature of the eutectic material 124, and hence causes the eutectic material 124 to become molten.

Figure 7:
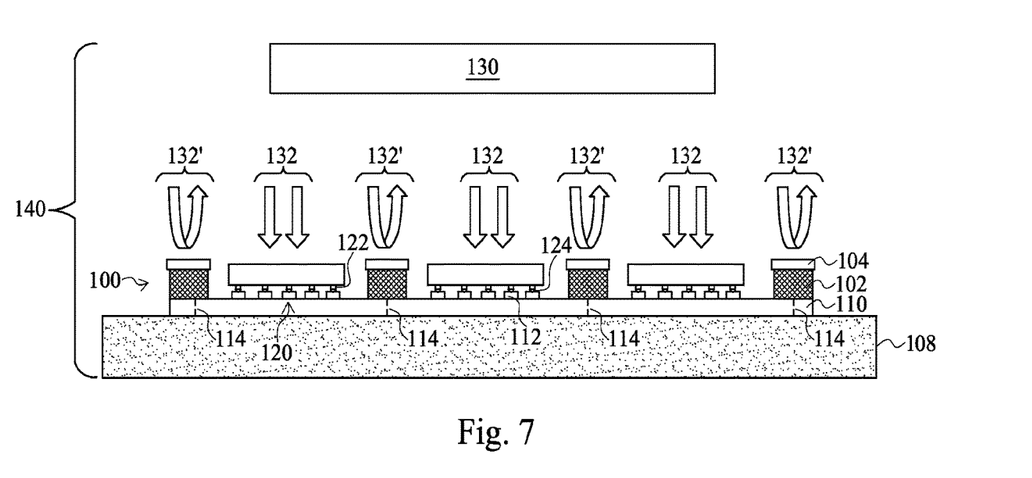

For example, in some embodiments, the eutectic material 124 is reflowed using a radiation energy source 130, as shown in FIG. 7. The radiation energy source 130 is activated to emit radiation energy 132 and 132'. In some embodiments, the radiation energy source 130 comprises an IR energy source that is adapted to emit IR energy, for example. Radiation energy 132 indicates energy that reaches the package components 120, and radiation energy 132' indicates radiation energy that is partially or substantially fully reflected away from portions of the tool 100 by the highly reflective second material 104. In some embodiments, the emission of the radiation energy 132 from the radiation energy source 130 comprises increasing a temperature of the package components 120 to a temperature of about 240 degrees C. to about 260 degrees C. Alternatively, other temperatures may be used.

The second package components 120 absorb the radiation energy 132 so that the underlying eutectic material 124 reaches a melting or reflow temperature, yet portions of the radiation energy 132' are reflected by the high reflectivity material of the second material 104 of the tool 100. The second material 104 of the tool 100 protects undesired portions of the first package components 110 from reaching undesired high temperatures, which reduces thermal expansion between the second package components 120 and the first package components 110 during the radiation energy eutectic material 124 reflow process, and also reduces warpage mismatch at the bonds between the contact pads 122 and 112 (which comprise flip chip bonds in some embodiments, for example) during the radiation energy eutectic material 124 reflow process, advantageously.

The radiation energy exposure process is continued for a predetermined time period that is adequate to form good solder joints comprised of the eutectic material 124. At the end of the reflow process, the eutectic material 124 is cooled and at least substantially, or fully, solidifies. The second package components 120 are thus bonded to the underlying first package components 110.

Exposing the tool 100 and the second package components 120 to the radiation energy 132/132' results in bonding of the second package components 120 to the first package components 110. Exposing the tool 100 and the second package components 120 to the radiation energy 132 comprises reflowing the eutectic material 124 disposed on each of the plurality of second package components 120, e.g., disposed over the contact pads 122.

In some embodiments, the support 108, the tool 100, and the radiation energy source 130 comprise a system 140. The system 140 may comprise an enclosed system contained within a chamber, or the system 140 may be unenclosed. The system 140 may include other functional elements, such as a temperature monitor and/or controller, and other elements, in some embodiments, as examples. The solder reflow system 140 may be a static system wherein the support 108 remains stationary during the reflow process. Alternatively, the system 140 may include a conveyor belt (not shown), and the support 108 may be placed on the conveyor belt. The support 108 with the first package components 110, the second package components 120, and the tool 100 disposed thereon is moved by the conveyor belt, and the system 140 may include one or more radiation energy sources 130 that expose the tool 100 and second package components 120 to radiation energy. The system 140 may alternatively comprise other configurations.

Figure 8:
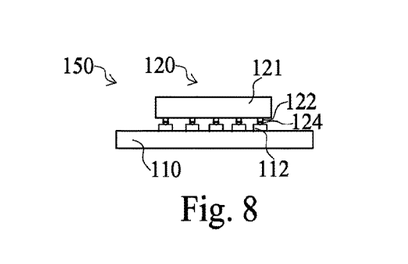
Figure 9:
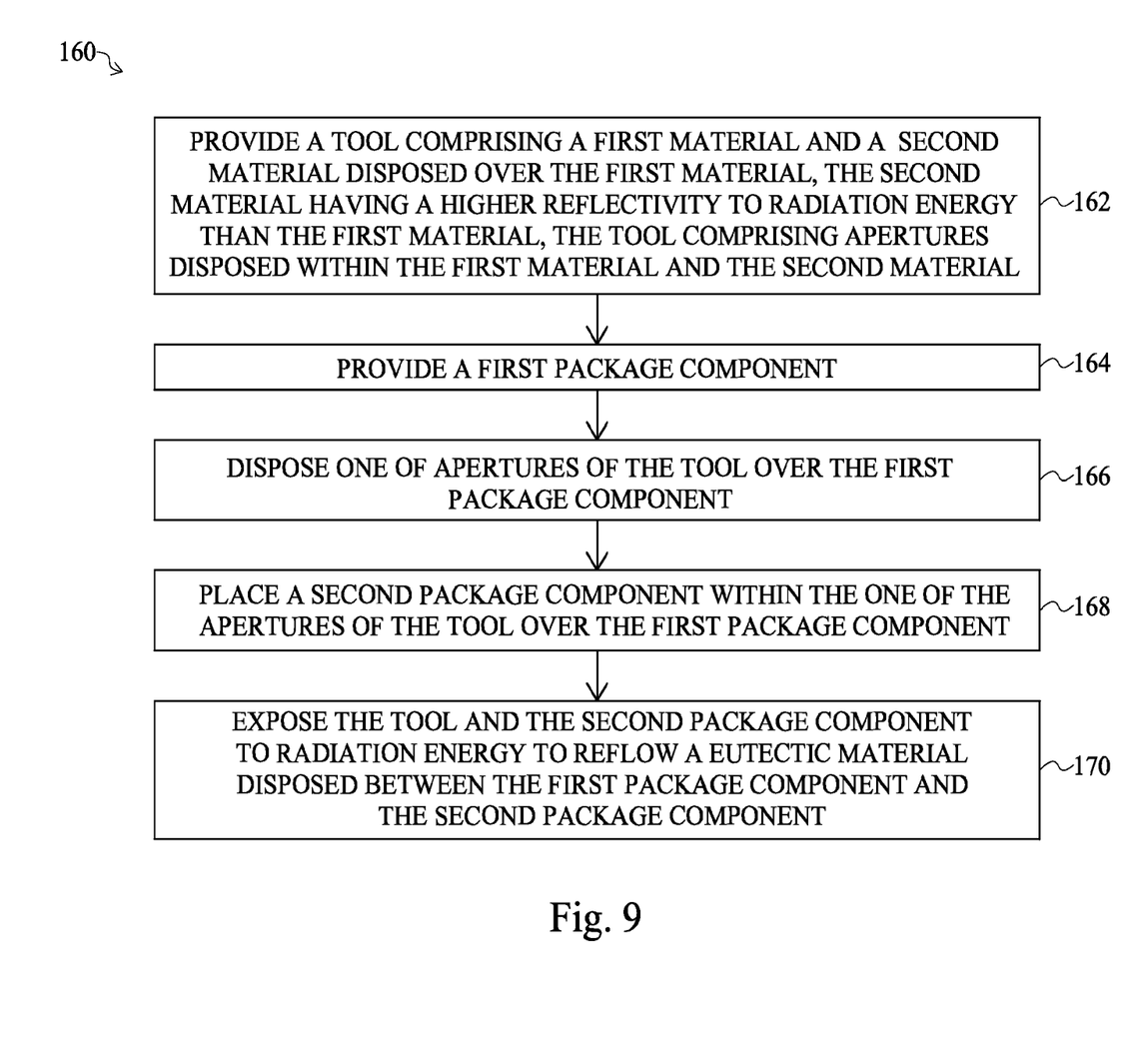
FIG. 9 is a flow chart of a method of processing a semiconductor device in accordance with some embodiments.

After the eutectic material 124 reflow process using the radiation energy 132/132' emitted from the radiation energy source 130, the tool 100 is removed, and the strip of first package components 110 is singulated along scribe lines 114 between adjacent ones of the plurality of second package components 120. Singulating the strip of first package components 110 comprises forming a plurality of packaged semiconductor devices 150, as shown in FIG. 8. The packaged semiconductor devices 150 may comprise packaged semiconductor dies, stacked dies, systems-on-a-chip (SOCs), wafer level package (WLP) devices, other types of devices, and/or combinations thereof in accordance with some embodiments.

For example, in embodiments wherein the first package components 110 comprise packaging substrates and the second package components 120 comprise semiconductor dies, or wherein the first package components 110 comprise semiconductor dies and the second package components 120 comprise packaging systems, the packaged semiconductor dies 150 comprise packaged semiconductor dies. The packaged semiconductor dies may comprise wafer level package (WLP) devices in some embodiments, for example.

In embodiments wherein the first package components 110 comprise semiconductor dies and the second package components 120 comprise semiconductor dies, packaged semiconductor devices 150 comprising stacked dies are formed. In embodiments wherein the first package components 110 comprise particular types of semiconductor dies (also not shown) that are adapted to function collectively with second package components 120 that also comprise semiconductor dies as a system, packaged semiconductor devices 150 comprising SOCs are formed.

FIG. 8 is a flow chart 160 of a method of processing a semiconductor device in accordance with some embodiments. In step 162, a tool 100 (see also FIGS. 1 and 2) is provided that comprises a first material 102 and a second material 104 disposed over the first material 102. The second material 104 has a higher reflectivity to radiation energy than the first material 102. The tool 100 includes apertures 106 disposed within the first material 102 and the second material 104. In step 164, a first package component 110 (see FIG. 4) is provided. In step 166, one of the apertures of the tool 100 is disposed over the first package component 110 (see FIG. 5). In step 168, a second package component 120 is placed within the one of the apertures of the tool 100 over the first package component 110 (see FIG. 6). In step 170, the tool 100 and the package component 120 are exposed to radiation energy 132/132' to reflow a eutectic material 124 disposed between the first package component 110 and the package component 120 (see FIG. 7).

Some embodiments of the present disclosure include tools 100 including the high IR reflective second material 104, and also include systems 140 that include the tool 100 having the second material 104 formed thereon. Methods of processing semiconductor devices using the novel tools 100 are also disclosed. Some embodiments of the present disclosure also include packaged semiconductor devices 150 that have been processed using the novel tools 100 and systems 140 described herein.

Advantages and benefits of some embodiments of the disclosure include providing novel tools 100 wherein the second material 104 comprising the high-reflectivity material reflects radiation energy 132' during a eutectic material 124 reflow process. Reflecting the radiation energy 132' away from predetermined regions of the tool 100 results in reduced thermal expansion and reduced warpage by avoiding heating undesired portions of the first package components 110 (e.g., by heat transference through the tool 100), which may have a different coefficient of thermal expansion (CTE) than the second package components 120, for example. Implementing the second material 104 on the tool 100 reduces strain and stress from CTE mismatch between the first package components 110 and the second package components 120.

The reflection of the radiation energy 132' by the second material 104 on the tool 100 advantageously results in a selective thermal heating effect on the first package components 110 during the solder reflow and/or a solder bonding process, which reduces the CTE mismatch between the first package components 110 and the second package components 120. Lowering the CTE mismatch reduces undesired expansion (e.g., of the first package component 110 material) and improves a fine pitch process capability in some applications, for example.

Overall product yields are increased due to the higher joint yields achieved by implementing the highly-reflective second material 104 in the tool 100, which improves the quality of the eutectic material 124 joints, i.e., solder joints. Cold joints of the eutectic material 124 are reduced or eliminated by implementing the second material 104 in the tool 100 in some embodiments. Thus, increased high joint yields are achievable by implementing the second material 104 on tools 100 in accordance with some embodiments. About 99% or greater joint yields may be achieved in accordance with some embodiments, for example. Furthermore, the novel tools 100 and process flows described herein are easily implementable in semiconductor device processing systems and process flows.

In accordance with some embodiments of the present disclosure, a tool for processing semiconductor devices includes a second material disposed over a first material, and apertures disposed within the first material and the second material. The second material comprises a higher reflectivity than the first material. Each of the apertures is adapted to retain a package component over a support.

In accordance with other embodiments, a system for processing semiconductor devices includes a radiation energy source, a support, and a tool disposable between the support and the radiation energy source. The tool comprises a first material comprising a first reflectivity to radiation energy and a second material comprising a second reflectivity to radiation energy disposed over the first material. The second reflectivity is greater than the first reflectivity. The tool includes apertures disposed within the first material and the second material. Each of the apertures is adapted to retain a package component over the support.

In accordance with other embodiments, a method of processing a semiconductor device includes providing a tool comprising a first material and a second material disposed over the first material, the second material having a higher reflectivity to radiation energy than the first material. The tool includes apertures disposed within the first material and the second material. The method includes providing a first package component, disposing one of the plurality of apertures of the tool over the first package component, and placing a second package component within the one of the plurality of apertures of the tool over the first package component. The tool and the second package component are exposed to radiation energy to reflow a eutectic material disposed between the first package component and the second package component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for processing semiconductor devices, comprising:
   an infrared (IR) energy source adapted to emit IR radiation energy;
   a support; and
   a tool disposable between the support and the IR radiation energy, wherein the tool comprises a first material comprising a first reflectivity to the IR radiation energy and a second material comprising a second reflectivity to the IR radiation energy disposed over the first material, the first material being disposed between the second material and the support, the second reflectivity being greater than the first reflectivity, wherein the tool comprises a plurality of apertures disposed within the first material and the second material, and wherein each of the plurality of apertures is adapted to retain a package component over the support, wherein the first material has a thickness that is 3,000 to 100,000 times greater than the second material.

2. The system according to claim 1, wherein the tool comprises a jig.

3. The system according to claim 1, wherein the package component comprises a first package component, and wherein the support comprises a board or a boat adapted to support a second package component.

4. The system according to claim 3, wherein the support is adapted to support a plurality of second package components, wherein the plurality of apertures is adapted to support the first package component over each of the plurality of second package components during a eutectic material bonding process.

5. The system according to claim 1, wherein the second material is adapted to reflect the IR radiation energy at a predetermined wavelength range.

6. The system according to claim 5, wherein the predetermined wavelength range comprises 800 nm to 100,000 µm.

7. The system according to claim 5, wherein the second material is adapted to reflect greater than 70% of the IR radiation energy at the predetermined wavelength range.

8. A system for processing semiconductor devices, comprising: an infrared (IR) energy source adapted to emit IR radiation energy; a support; and a tool disposable between the support and the IR radiation energy, wherein the tool comprises a first material comprising a first reflectivity to the IR radiation energy and a second material comprising a second reflectivity to the IR radiation energy disposed over the first material, wherein the first material is disposed between the support and the second material, the second reflectivity being greater than the first reflectivity, wherein the tool comprises a plurality of apertures disposed within the first material and the second material, and wherein each of the plurality of apertures is adapted to retain a package component over the support, the second material comprising a metal, wherein the first material has a thickness that is 3,000 to 300,000 times greater than the second material.

9. The system of claim 8, wherein the metal comprises a material selected from the group consisting essentially of Au, Ag, Cu, Cr, Zn, Sn, and combinations thereof.

10. The system of claim 8, wherein the second material comprises a thin film material having a thickness of 1 µm or less.

11. The system of claim 10, wherein the thin film material comprises a material selected from TiO2-doped epoxy, TiO2-doped polymer, and combinations thereof.

12. The system of claim 8, wherein the first material comprises a material selected from the group consisting essentially of a metal, a metal alloy, a ceramic material, and combinations thereof.

13. The system of claim 8, wherein the second material is adapted to reflect the IR radiation energy at a wavelength of between 800 nm to 100,000 µm.

14. The system of claim 8, wherein the second material comprises a TiO2-doped epoxy.

15. A system for processing semiconductor devices, comprising:
an infrared (IR) energy source adapted to emit IR radiation energy;
a support; and
a tool disposable between the support and the IR radiation energy, wherein the tool comprises a first material and a second material, the first material being disposed between the support and the second material, the first material comprising a first reflectivity to the IR radiation energy, the second material comprising a second reflectivity to the IR radiation energy, the second reflectivity being greater than the first reflectivity, wherein the tool comprises a plurality of apertures disposed within the first material and the second material, and wherein each of the plurality of apertures is adapted to retain a package component over the support, the second material comprising chromium, wherein the second material has a thickness that is 3,000 to 300,000 smaller than the first material.

16. The system of claim 15, wherein the first material is clamped to the support.

17. The system of claim 15, wherein the first material has a thickness of 1 mm to 3 mm.

18. The system of claim 15, wherein the second material has a thickness of 100 Angstroms to 1 µm.

19. The system of claim 1, wherein the first material has a first width in a cross-sectional view through an aperture of the plurality of apertures, the first width being measured perpendicular to an interface of the first material with the second material, wherein the second material has a second width in the cross-sectional view through the aperture, the second width being measured perpendicular to the interface of the first material with the second material, and wherein the first width is smaller than the second width.

20. The system of claim 15, wherein the tool has a length and a width in a top view of about 300 mm by 700 mm.

\* \* \* \* \*

UNITED STATES PATENT AND TRADEMARK OFFICE
CERTIFICATE OF CORRECTION

PATENT NO. : 11,355,471 B2
APPLICATION NO. : 16/051235
DATED : June 7, 2022
INVENTOR(S) : Kuei-Wei Huang

Page 1 of 1

It is certified that error appears in the above-identified patent and that said Letters Patent is hereby corrected as shown below:

In the Claims

Claim 20, Column 12, Line 37; delete "about".

Signed and Sealed this
Second Day of August, 2022

Katherine Kelly Vidal
*Director of the United States Patent and Trademark Office*